United States Patent [19]

Bloem

[11] 4,049,416
[45] Sept. 20, 1977

[54] METHOD OF JOINING A METAL PART HAVING A COPPER SURFACE AND A GLASS PART

[75] Inventor: Herman Bloem, Eindhoven, Netherlands

[73] Assignee: U.S. Philips Corporation, New York, N.Y.

[21] Appl. No.: 633,625

[22] Filed: Nov. 20, 1975

[30] Foreign Application Priority Data

Dec. 19, 1974 Netherlands .................. 7416556

[51] Int. Cl.² ........................................... C03G 27/02
[52] U.S. Cl. ...................................... 65/32; 65/59 R; 106/53
[58] Field of Search ................. 65/32, 59 R; 106/53

[56] References Cited

U.S. PATENT DOCUMENTS

| 2,386,820 | 10/1945 | Spencer | 65/32 |
| 2,803,926 | 8/1957 | Ekkers | 65/32 X |
| 2,955,385 | 10/1960 | McDuffee | 65/32 |
| 3,069,876 | 12/1962 | Certa et al. | 65/32 X |
| 3,203,084 | 8/1965 | Best | 65/32 X |
| 3,607,176 | 9/1971 | Milochevitch | 65/32 |
| 3,802,892 | 4/1974 | Pirooz | 65/32 X |
| 3,876,407 | 4/1975 | Hirose et al. | 65/32 X |
| 3,904,426 | 9/1975 | Frieser et al. | 65/32 X |
| 3,914,517 | 10/1975 | Pirooz | 65/32 |
| 3,973,975 | 8/1976 | Francel et al. | 65/32 X |
| 3,982,918 | 9/1976 | Frieser et al. | 65/32 X |

*Primary Examiner*—S. Leon Bashore
*Assistant Examiner*—Frank W. Miga
*Attorney, Agent, or Firm*—Frank R. Trifari; Robert S. Smith

[57] ABSTRACT

Bonding a metal part having a copper surface to glass, in particular a semiconductor device. A small quantity of $Cr_2O_3$ or CuO is added to the glass. The copper is oxidized at a relatively low temperature and relatively low oxygen pressure and thereafter sealing-in is performed in a nonoxidizing atmosphere.

4 Claims, No Drawings

METHOD OF JOINING A METAL PART HAVING A COPPER SURFACE AND A GLASS PART

The invention relates to a procedure for bonding a metal part, of which at least the surface consists of copper, to a glass whose coefficient of expansion is suitable for sealing to the metal part.

According to the known procedure, see for example the manual by Espe and Knoll, "Werkstoffkunde der Hochvakuumtechnik," Springer Verlag, Berlin 1936, page 328, copper-clad wire having a nickel-iron core, is first superficially oxidized and thereafter fused. In this process the temperature must not be raised to too high a value if the temperature is too high the $Cu_2O$ which is responsible for a good bond will completely dissolve in the glass.

Oxidizing copper-clad wire in the same furnace cycle as melting the glass has quite a few drawbacks one example relates to components such as those which are used in the semiconductor technique for which as a rule, graphite jigs are used. An oxidizing atmosphere at a higher temperature is undesired cause rather expensive jigs to be destroyed very quickly.

The invention provides a procedure in which the copper need only be oxidized very little to obtain a proper glass-to-metal bond, so that there is no objection to the oxidation taking place during the sealing-in or fusing step in graphite jigs. It is therefore characterized in that a chromium compound and/or a copper compound in a quantity of between 0.2 and 5% by weight, calculated as $Cr_2O_3$ and CuO respectively is added to the basic composition of the glass. The copper oxidation takes place in an oxidizing atmosphere at the lowest possible temperature, above approximately 300° C provided that, as the portion of the above addition and/or the temperature are higher the required oxygen pressure may be lower and the assembly is than heated to fusion in a non-oxidizing atmosphere.

In general a chromium compound is preferred for because copper compounds can be easily reduced to copper metal. This is less attractive for most applications.

The copper surface to which the chromium-oxide-containing glass must be sealed, must be clean; preferably by heating in a reducing atmosphere prior to fusion.

An important application of the procedure according to the invention is in the semi-conductor technique, namely the enveloping of diodes, where the semi-conductor crystal is clamped between two contact pads. It is important that these contact pads have a good thermal conductivity, so that the heat generated by the semiconductor can be quickly dissipated. These contact pads are made of copper-clad wire which is cut or sawn to short lengths. By using the procedure according to the invention it is now possible, before sealing the contact pad with the clamped-between crystal in the enveloping glass tube, to copperplate the pads by means of electroplating in a barrel plating device or other plating techniques. In the plating process the end faces of the pads, i.e. the ends where they have been cut off or sawn off, will be coated with copper, which enables a better heat dissipation of the crystal. The slight oxidation of the copper when the procedure according to the invention is used is no hindrance for a proper contact between the semiconductor element and the pad.

To explain the invention, the description of manufacturing an enveloped semiconductor device follows hereafter.

Copper-clad wire having a diameter of 1.5 mm, consisting of a core of nickel-iron wire (42 Ni-58Fe) and a copper sleeve, so that the copper constitutes 24% by weight of the wire, was cut into 2.5mm lengths, etched and copperplated in a barrel until a layer thickness of 15μ was obtained. The pads thus obtained were soldered with eutectic copper-silver at one side to a copper wire having a thickness of 1 mm.

Glass powder consisting of glass of one of the following compositions were mixed with a methacrylate binder in a quantity of 2.5% by weight and tubes were pressed from this mixture having an outside diameter of 3.5mm, an inside diameter of 1.9 mm and a length of 5mm.

TABLE

| | glass composition (% by weight) | | | | |
|---|---|---|---|---|---|
| $SiO_2$ | 35.1 | 34.5 | 35.2 | 68.5 | 52.7 |
| $K_2O$ | 4.7 | 4.7 | 4.7 | 0.9 | 14.8 |
| $Li_2O$ | 2.0 | 1.9 | 2.0 | — | — |
| $Na_2O$ | — | — | — | 16.8 | — |
| CaO | — | — | — | 5.4 | — |
| BaO | — | — | — | 2.2 | — |
| MgO | — | — | — | 2.8 | — |
| $Al_2O_3$ | 2.5 | 2.4 | 2.5 | 1.8 | 1.3 |
| PbO | 54.6 | 53.8 | 54.7 | — | 30.0 |
| $Sb_2O_3$ | | | | 0.7 | 0.3 |
| CoO | 0.9 | 0.9 | — | — | — |
| $Cr_2O_3$ | 0.2 | 1.8 | 0.9 | 0.9 | 0.9 |
| Sintering temp. °C | 530 | 530 | 530 | 650 | 580 |
| Sealing temp. °C | 680 | 680 | 680 | 830 | 740 |

The above glass were obtained by adding a chromium compound, such as $Cr_2O_3$, $CrO_3$ or $K_2Cr_2O_7$ to the basic mixture, melting the whole and grinding the melted product thereafter.

The tubes were sintered at the specified temperature and thereafter the pads, provided with leads were placed against the tubes with the addition of the semiconductor crystal and the whole was thereafter put in a graphite jig in a furnace. The jig was heated in air to 350° C and kept at this temperature for half a minute, followed by heating in pure nitrogen to the sealing temperature specified in the table. This temperature was maintained for 1 minute.

According to a variant of this procedure the copper oxidation took place in a furnace which was evacuated to a pressure of between 5 and 10 Torr (= mm Hg). In this manner a partial oxygen pressure is adjusted to between 1 and 2 Torr. The jig was then heated to 500° C and kept at this temperature for half a minute, whereafter pure nitrogen was admitted. In this atmosphere the sealing operation took place at the temperature specified in the table, which was maintained for 1 minute.

With both procedures products were obtained having an exceptionally good glass-to-metal bond based on comparative tensile strength tests. If the tests are performed with glass without the additions according to the invention then glass-to-metal bonding does not produce a sufficiently strong bond. Analogous results one obtained if the $Cr_2O_3$ in the glass was replaced by an equally large content in CuO.

A version of a diode manufactured by prior art techniques which load of has a maxium load rating of 1.3W can, in the version according to the invention easily stand 20% higher loads.

What is claimed is:

1. A method for joining a metal part, of which at least the surface consists of copper, to a glass having a coefficient of expansion suitable for joining to the metal part which comprises the sequential steps of: providing a basic mixture of glass which includes at least one material selected from the group consisting of chromium and copper compounds, the total quantity of materials from said group being between 0.2 and 5% by weight calculated as $Cr_2O_3$ and CuO respectively; providing a copper exterior surface; holding the copper exterior surface in abutting relationship to said basic mixture of glass; oxidizing the copper exterior surface abutting said mixture of glass in an oxidizing atmosphere at substantially the lowest possible temperature for said oxidizing atmosphere and then heating both said mixture of glass and said exterior surface in a non-oxidizing atmosphere.

2. A method as described in claim 1 wherein said basic mixture of glass is provided in a glass powder form.

3. A method as described in claim 1 wherein said one material from said group consisting of chromium and copper compounds is $Cr_2O_3$ and said heating step is conducted at a temperature in the range of 680° to 830° C.

4. A method as described in claim 1 wherein said one material from said group consisting of chromium and copper compounds is CuO and said heating step is conducted at a temperature in the range of 680° to 830° C.

* * * * *